United States Patent
Zhang et al.

(10) Patent No.: US 10,418,508 B2
(45) Date of Patent: Sep. 17, 2019

(54) FULL-LASER SCRIBING METHOD FOR LARGE-AREA COPPER INDIUM GALLIUM SELENIDE THIN-FILM SOLAR CELL MODULE

(71) Applicants: BEIJING SIFANG AUTOMATION CO., LTD., Beijing (CN); BEIJING SIFANG CRENERGEY OPTOELECTRONICS TECHNOLOGY CO., LTD., Beijing (CN)

(72) Inventors: Ning Zhang, Beijing (CN); Xinping Yu, Beijing (CN); Wanlei Dai, Beijing (CN)

(73) Assignees: BEIJING SIFANG AUTOMATION CO., LTD., Beijing (CN); BEIJING SIFANG CRENERGEY OPTOELECTRONICS TECHNOLOGY CO., LTD., Beijing (CN)

(*) Notice: Subject to any disclaimer, the term of this patent is extended or adjusted under 35 U.S.C. 154(b) by 0 days.

(21) Appl. No.: 15/573,275

(22) PCT Filed: May 17, 2016

(86) PCT No.: PCT/CN2016/000265
§ 371 (c)(1),
(2) Date: Nov. 10, 2017

(87) PCT Pub. No.: WO2016/188120
PCT Pub. Date: Dec. 1, 2016

(65) Prior Publication Data
US 2018/0114876 A1    Apr. 26, 2018

(30) Foreign Application Priority Data
May 25, 2015    (CN) .......... 2015 1 0271942

(51) Int. Cl.
*H01L 31/18* (2006.01)
*H01L 31/046* (2014.01)
(Continued)

(52) U.S. Cl.
CPC .... *H01L 31/186* (2013.01); *H01L 31/022425* (2013.01); *H01L 31/022483* (2013.01);
(Continued)

(58) Field of Classification Search
CPC combination set(s) only.
See application file for complete search history.

(56) References Cited

U.S. PATENT DOCUMENTS

2008/0304525 A1* 12/2008 Kupisiewicz .......... B41M 5/262
                                                            372/30
2012/0111388 A1*  5/2012 Sung ................... H01L 31/0392
                                                            136/244
(Continued)

FOREIGN PATENT DOCUMENTS

| CN | 102231398 A | 11/2011 |
| CN | 102473769 A | 5/2012 |
| CN | 102598301 A | 7/2012 |
| CN | 104993013 A | 10/2015 |

OTHER PUBLICATIONS

International Search Report for PCT/CN2016/000265 dated Aug. 26, 2016 [PCT/ISA/210].

*Primary Examiner* — Ratisha Mehta
(74) *Attorney, Agent, or Firm* — Sughrue Mion, PLLC

(57) ABSTRACT

Disclosed is a full-laser scribing method for a large-area copper indium gallium selenide (CIGS) thin-film solar cell module, including: using a laser I to scribe a molybdenum thin film prepared on soda-lime glass to form a first scribed line (P1); preparing the following film layers in sequence on the molybdenum layer in which P1 has been scribed: a CIGS layer, a cadmium sulfide layer and an intrinsic zinc oxide (Continued)

layer; after finishing preparation of the above film layers, using a laser II for scribing to form a second scribed line (P2), wherein the scribed line P2 is parallel with the scribed line P1; and preparing an aluminum-doped zinc oxide layer on the intrinsic zinc oxide layer in which P2 has been scribed, and using a laser III for scribing to form a third scribed line (P3), wherein the scribed line P3 is parallel with the scribed line P1.

8 Claims, 4 Drawing Sheets

(51) Int. Cl.
*H01L 31/0224* (2006.01)
*H01L 31/0749* (2012.01)
*H01L 31/0463* (2014.01)

(52) U.S. Cl.
CPC ........ *H01L 31/046* (2014.12); *H01L 31/0463* (2014.12); *H01L 31/0749* (2013.01); *H01L 31/1884* (2013.01); *Y02E 10/541* (2013.01)

(56) References Cited

U.S. PATENT DOCUMENTS

2015/0068578 A1\* 3/2015 Probst ................. H01L 31/0322
136/244
2018/0045232 A1\* 2/2018 Capostagno ....... B23K 26/0006

\* cited by examiner

FULL-LASER SCRIBING METHOD FOR LARGE-AREA COPPER INDIUM GALLIUM SELENIDE THIN-FILM SOLAR CELL MODULE

CROSS REFERENCE TO RELATED APPLICATIONS

This application is a National Stage of International Application No. PCT/CN2016/000265 filed May 17, 2016, claiming priority based on Chinese Patent Application No. 201510271942.8 filed May 25, 2015, the contents of all of which are incorporated herein by reference in their entirety.

TECHNICAL FIELD

The present invention belongs to the technical field of thin-film solar cells, more particularly, to a method for manufacturing a large-area copper indium gallium selenide (CIGS) thin-film solar cell module.

BACKGROUND ART

Energy crisis and environmental pollution are two fundamental problems the world is facing now. Inexhaustible solar energy is an important way to solve the energy crisis. Because its material has the advantages of tunable optical band gap, strong anti-radiation ability, stable battery performance and stability, excellent weak light tolerance and the like, the copper indium gallium selenide (CIGS) thin-film solar cell has become one of the most promising photovoltaic materials in thin-film solar cells.

Cell inner connection technology is one of the key technologies in the production of copper indium gallium selenide thin-film solar modules. At present, for the production of large-area copper indium gallium selenide thin-film solar cell modules, a mechanical needle is commonly used for scribing in the industry, its processing speed is generally about 0.5 m/s, the processed line width is usually up to 50-80 μm or above, flanging and edge breakage are likely to occur, the dead zone width can reach 500 μm-600 μm or more, the power loss of the module is high; moreover, the mechanical needle is seriously damaged and needs to be replaced frequently and equipment has to be maintained regularly, which increase the manufacturing cost of the module. According to the full-laser scribing method described in the present invention, the repetition frequency of a laser can be 30 MHz-1 GHz, so the processing speed can reach 2-3 m/s. By focusing the laser, the width of a scribed line can be reduced, the flanging and edge breakage can be reduced or even eliminated, and the width of a dead zone is reduced to 200 μm or below, thus greatly reducing the power loss of the module after scribing and also achieving high processing efficiency and low production cost. In addition, the laser has the characteristics of stable operation, long service life and the like, thus reducing maintenance cost and production cost of the equipment.

SUMMARY OF THE INVENTION

An objective of the present invention is to provide a full-laser scribing method for a large-area copper indium gallium selenide (CIGS) thin-film solar cell module to complete all three scribed lines of a CIGS thin-film solar cell to realize inner connection of sub-cells of a solar cell module. As the repetition frequency of a laser reaches 30 MHz-1 GHz, the processing speed can reach 2-3 m/s. Focusing the laser can decrease the scribed line width, reduce or even eliminate the flanging and edge breakage, and reduce the width of the dead zone to 200 μm or below, thus greatly reducing the power loss of the module after scribing, and also ensuring high processing efficiency and low production cost. In addition, the laser has the characteristics of stable operation, long service life and the like, thus reducing equipment maintenance cost.

The present invention provides a full-laser scribing method for a large-area CIGS thin-film solar cell module, comprising the following steps:

(1) preparing a molybdenum layer on a soda-lime glass substrate;

(2) using a laser I to scribe off the molybdenum layer to form a first scribed line (P1), wherein the first scribed line (P1) is scribed till reaching the surface of the soda-lime glass so that sub-cells on both sides of the first scribed line (P1) are completely insulated;

(3) preparing a copper indium gallium selenide film layer on the molybdenum layer;

(4) preparing a cadmium sulfide layer on the copper indium gallium selenide film layer;

(5) preparing an intrinsic zinc oxide layer on the cadmium sulfide layer;

(6) using a laser II to scribe off the intrinsic zinc oxide layer, the cadmium sulfide layer and the copper indium gallium selenide layer at the same time to expose the molybdenum layer and thus form a second scribed line (P2), wherein the second scribed line (P2) completely scribes off the three thin film layers, i.e., the intrinsic zinc oxide layer, the cadmium sulfide layer and the copper indium gallium selenide layer, without damaging the surface of the molybdenum layer, and the second scribed line (P2) keeps parallel with the first scribed line (P1);

(7) preparing an aluminum-doped zinc oxide layer on the intrinsic zinc oxide layer;

(8) using the laser III to scribe off the aluminum-doped zinc oxide layer, the intrinsic zinc oxide layer, the cadmium sulfide layer and the copper indium gallium selenide layer at the same time to expose the molybdenum layer and form a third scribed line (P3), thus completing the inner connection of sub-cells of the copper indium gallium selenide thin-film solar cell module; wherein the third scribed line (P3) is formed by completely scribing off the four thin film layers, i.e., the aluminum-doped zinc oxide layer, the intrinsic zinc oxide layer, the cadmium sulfide layer and the copper indium gallium selenide layer, without damaging the surface of the molybdenum layer, and wherein the third scribed line (P3) keeps parallel with the first scribed line (P1) and the second scribed line (P2).

According to the above-mentioned full-laser scribing method for a large-area copper indium gallium selenide thin-film solar cell module, the laser I, the laser II and the laser III are all one of a nanosecond laser, a sub-nanosecond laser, or a picosecond laser, wherein the nanosecond laser is a pulse fiber laser with the laser wavelength mode of one or more than two of 1064 nm, 532 nm and 355 nm, the beam mode of $TEM_{00}$, the beam quality ($M^2$) of less than 1.3, the pulse width of 1 nanosecond to 600 nanoseconds, the single pulse energy of 1 μJ to 2000 μJ, the pulse repetition frequency of 1 kHz to 1000 kHz, and the average power of 0 to 25 watts; the subnanosecond laser is a semiconductor laser with the laser wavelength mode of one or more than two of 1064 nm, 532 nm and 355 nm, the beam mode of $TEM_{00}$, the beam quality ($M^2$) of less than 1.3, the pulse width of 600 picoseconds to 2000 picoseconds, the single pulse energy of 1 μJ to 300 μJ, the pulse repetition frequency of 10 kHz to 100 kHz, and the average power of 0 to 3 watts; the picosecond laser is a pulse fiber laser with the laser wavelength mode of one or more than two of 1064 nm, 532 nm and 355 nm, the beam mode of $TEM_{00}$, the beam quality ($M^2$) of less than 1.3, the pulse width of less than 10 picoseconds, the single pulse energy of 1 µJ to 40 µJ, the pulse repetition frequency of 1Hz to 1000 KHz, and the average power of 0 to 6 watts.

According to the above-described full-laser scribing method for a large-area copper indium gallium selenide thin-film solar cell module, characterized in that the first scribed line (P1) can be scribed with laser either in the form of entering from a film surface or from a glass surface; the laser entering from the film surface means that the laser beams are in the direction of a thin film-coated surface and are focused on the thin film surface through a focusing lens; the laser entering from the glass surface means that laser beams are in a direction opposite to the thin film-coated surface, i.e., at the bottom of the substrate, and are focused on the thin film by the focusing lens after passing through the glass substrate.

According to the above-described full-laser scribing method for a large-area copper indium gallium selenide thin-film solar cell module, characterized in that the second scribed line (P2) is formed with laser entering from the film surface.

According to the above-described full-laser scribing method for a large-area copper indium gallium selenide thin-film solar cell module, characterized in that the third scribed line (P3) is formed with laser entering from the film surface.

According to the above-described full-laser scribing method for a large-area copper indium gallium selenide thin-film solar cell module, characterized in that the thickness of the molybdenum layer is 600 nm to 1200 nm; the thickness of the copper indium gallium selenide layer is 1.0 µm to 2.0 µm; the thickness of the cadmium sulfide layer is 30 nm to 80 nm; the thickness of the intrinsic zinc oxide thin film is 50 nm to 150 nm; and the thickness of the aluminum-doped zinc oxide thin film is 300 nm to 1000 nm.

According to the above-described full-laser scribing method for a large-area copper indium gallium selenide thin-film solar cell module, characterized in that the first scribed line (P1) is parallel with the edge of the glass substrate, the second scribed line (P2) is parallel with P1, and the third scribed line (P3) is parallel with P1 too.

According to the present invention, the full-laser scribing method is adopted to achieve the inner connection of the sub-cells of the large-area copper indium gallium selenide thin-film solar cell module, which can effectively reduce the dead zone area of the module, improve the module power of the copper indium gallium selenide thin-film solar cell, avoid the problem that mechanical needles need to be replaced frequently in the traditional mechanical technology, increase the production efficiency of the module and reduce the production and maintenance costs.

DETAILED DESCRIPTION OF THE EMBODIMENTS

The technical solutions of the present invention will be further described in embodiments below with reference to the accompanying drawings.

Embodiment 1

Figure 1:
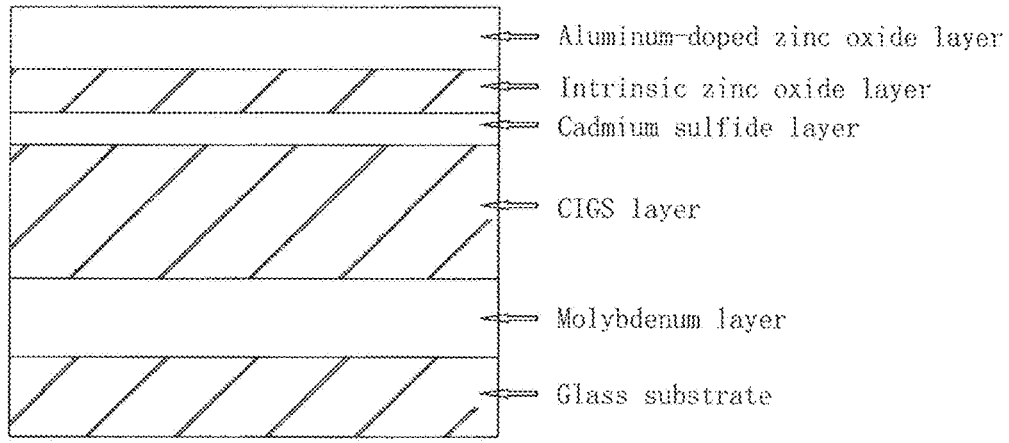
FIG. 1 is a schematic diagram of the structure of a copper indium gallium selenide thin-film solar cell according to the present invention.
Figure 2:
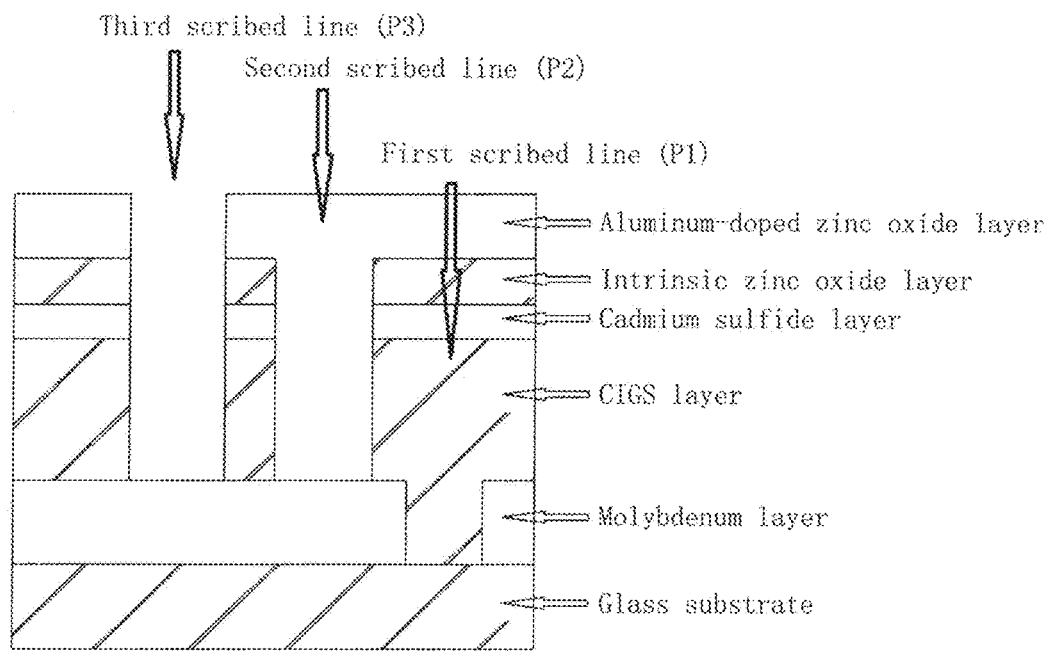
FIG. 2 is a schematic diagram of a full-laser scribing method for a copper indium gallium selenide thin-film solar cell module according to the present invention.

FIG. 1 is a schematic view of a structure of a large-area copper indium gallium selenide thin-film solar cell according to the present invention. As shown in FIG. 1, the cell includes a glass substrate, a molybdenum layer, a copper indium gallium selenide layer, a cadmium sulfide layer, an intrinsic zinc oxide layer and the aluminum-doped zinc oxide layer. FIG. 2 is a schematic diagram of a full-laser scribing method for a copper indium gallium selenide thin-film solar cell module according to the present invention; as shown in FIG. 2, the full-laser scribing method comprises laser scribing of three scribed lines: first, preparing a molybdenum film on the glass substrate, and using a laser I to scribe off the prepared molybdenum film to form the first scribed line (P1); preparing the following film layers on the molybdenum layer in which P1 has been scribed: a CIGS thin film, a cadmium sulfide thin film and an intrinsic zinc oxide thin film; using a laser II for scribing to form a second scribed line (P2), wherein the scribed line P2 is parallel with the scribed line P1, and copper indium gallium selenide, cadmium sulfide and intrinsic zinc oxide above the molybdenum layer are completely removed during the scribing of the second scribed line; and preparing an aluminum-doped zinc oxide layer on the intrinsic zinc oxide layer in which P2 has been scribed, and using a laser III for scribing to form a third scribed line (P3), wherein the scribed line P3 is parallel with the scribed line P1 and copper indium gallium selenide, cadmium sulfide, intrinsic zinc oxide, and aluminum-doped zinc oxide above the molybdenum layer are completely removed during the scribing of the third scribed line.

According to the present invention, the manufacturing method of the cell comprises the following steps:

Step 1: preparation of a molybdenum film: preparing a Mo film on a soda-lime glass substrate by DC magnetron sputtering, wherein the thickness of the Mo film layer is 1 µm.

Figure 3:
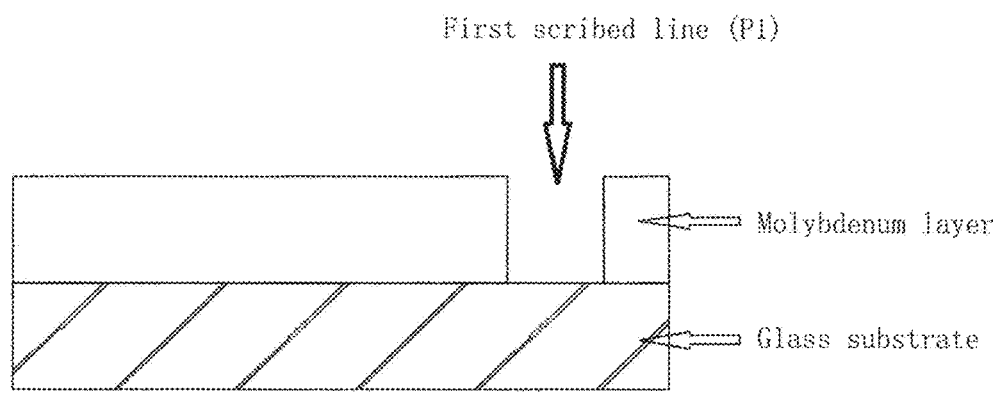
FIG. 3 is a schematic diagram of the scribing of P1 according to the present invention.
Figure 6:
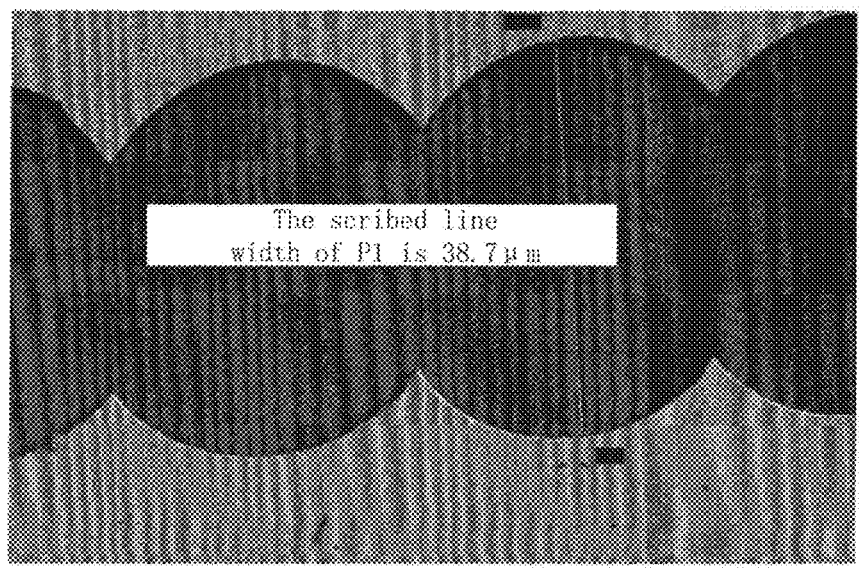
FIG. 6 is a topographic view after the scribing of P1 in Embodiment 1.

Step 2, scribing of P1: using a picosecond laser with pulse width of 8 picoseconds, wavelength of 1064 nm, scribing power of 0.55 W, single pulse energy of 6.88 µJ, repetition frequency of 80 kHz to scribe P1 in a sample with laser entering from the back of the film-coated substrate at a scribing speed of 2 m/s, wherein the width of the scribed line is 38.7 µm, the schematic diagram of the scribing is as shown in FIG. 3, and the molybdenum layer in the scribed line is completely removed to expose the surface of the soda-lime glass; and the effect after the scribing is as shown in FIG. 6.

Step 3: preparation of a copper indium gallium selenide thin film: with the method of selenylation after magnetization sputtering of a metal preset-film, preparing a copper indium gallium selenide layer on the substrate in which P1 has been scribed, wherein the thickness of the copper indium gallium selenide film layer is 1 µm.

Step 4: preparation of a cadmium sulfide thin film: preparing a cadmium sulfide layer on a deposited CIGS thin film by a chemical bath deposition method, wherein the thickness of the cadmium sulfide film layer is 50 nm.

Step 5: preparation of an intrinsic zinc oxide thin film: with a DC magnetron sputtering method, preparing an intrinsic zinc oxide layer on the substrate on which the cadmium sulfide thin film is prepared, wherein the thickness of the intrinsic zinc oxide film layer is 50 nm.

Figure 4:
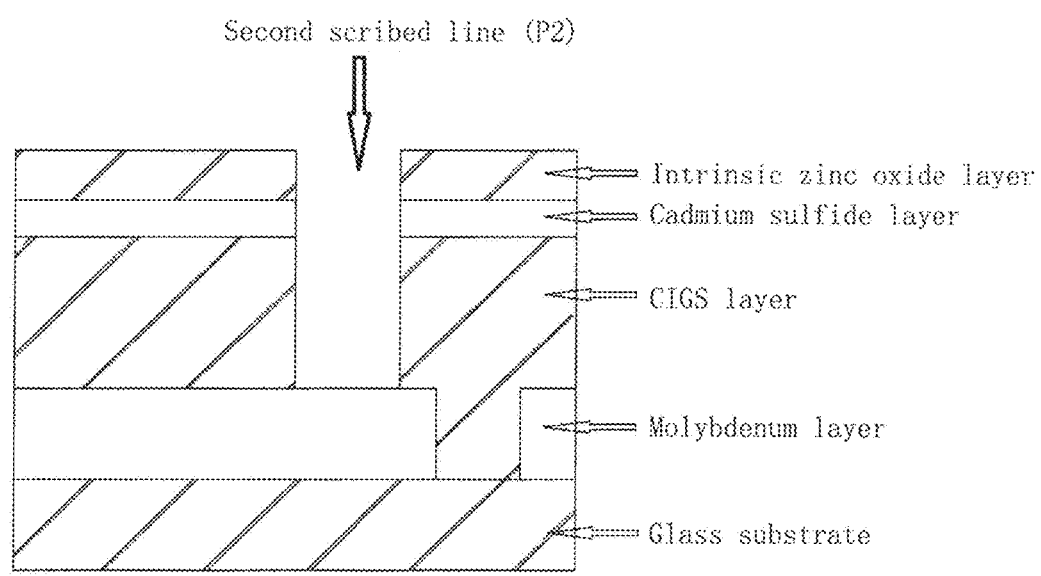
FIG. 4 is a schematic diagram of the scribing of P2 according to the present invention.
Figure 7:
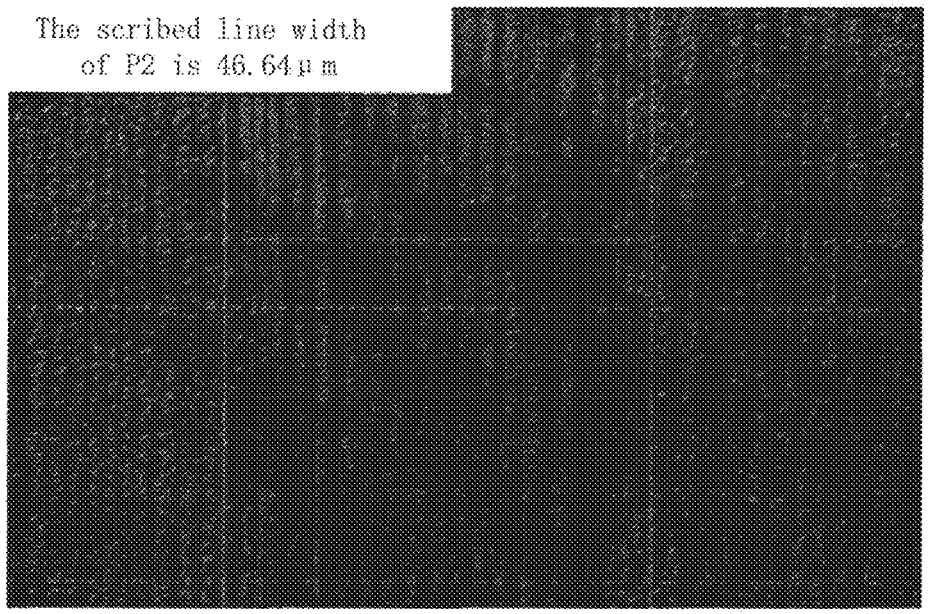
FIG. 7 is a topographic view after the scribing of P2 in Embodiment 1.

Step 6: scribing of P2: using a picosecond laser with pulse width of 8 picoseconds, wavelength of 1064 nm, scribing power of 5 W, single pulse energy of 5 µJ, and repetition frequency of 1000 kHz to scribe P2 in the sample with laser entering from the film surface of the film-coated glass at a scribing speed of 2 m/s, wherein the width of the scribed line is 46.64 µm, the schematic diagram of the scribing is as shown in FIG. 4, and the intrinsic zinc oxide, cadmium sulfide and copper indium gallium selenide of the cell are completely scribed off to expose the molybdenum layer; and the effect after the scribing is as shown in FIG. 7; in addition, an automatic tacking system is used to make sure that the scribed line P2 is parallel with the scribed line P1.

Step 7: Preparation of an aluminum-doped zinc oxide thin film: with a magnetron sputtering method, preparing an aluminum zinc oxide layer on a substrate in which P2 is scribed, wherein the thickness of the aluminum-doped zinc oxide film layer is 800 nm.

Figure 5:
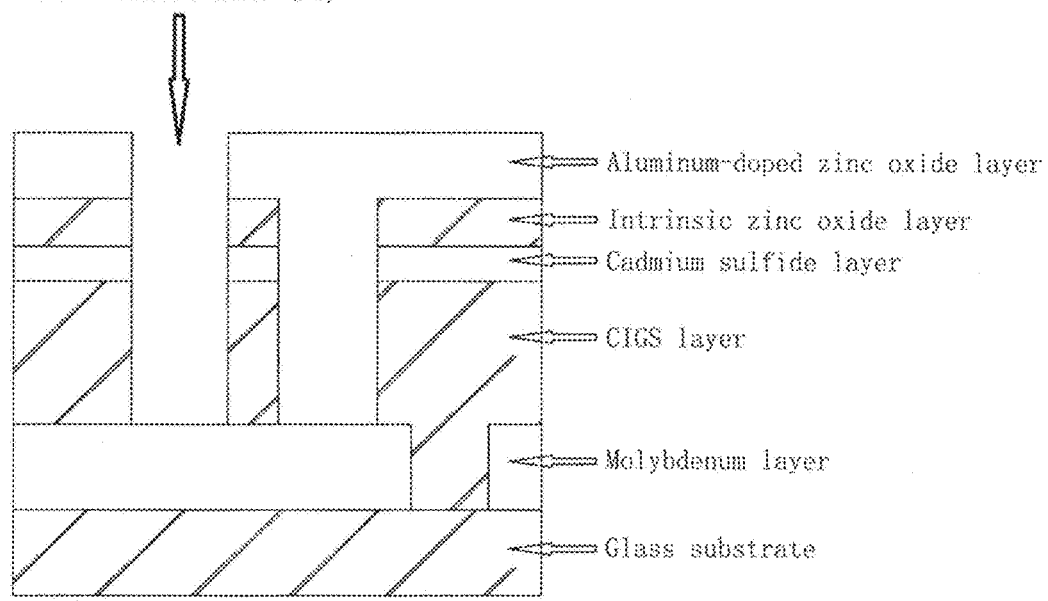
FIG. 5 is a schematic diagram of the scribing of P3 according to the present invention.
Figure 8:
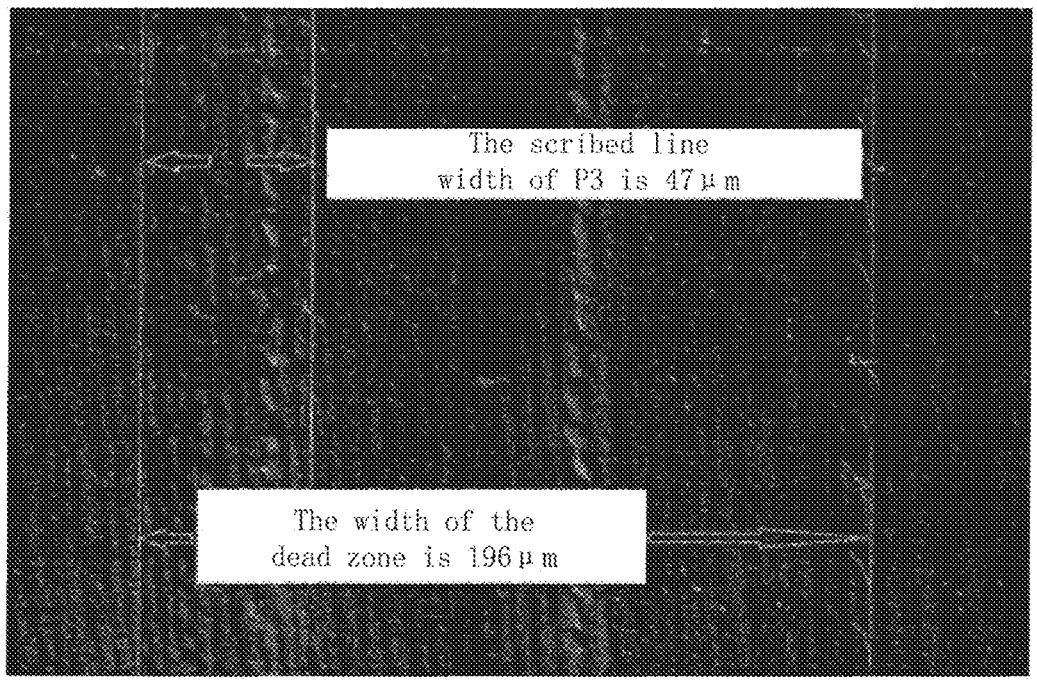
FIG. 8 is a perspective view after the scribing of P3 in Embodiment 1.

Step 8, scribing of P3: using a picosecond laser with pulse width of 8 picoseconds, wavelength of 1064 nm, scribing power of 5.5 W, single pulse energy of 5.5 µJ, and repetition frequency of 1000 kHz to scribe P3 in the sample with laser entering from the film surface of the film-coated glass at a scribing speed of 2 m/s so that the intrinsic zinc oxide layer, the cadmium sulfide layer and the copper indium gallium selenide layer are completely scribed off to expose the molybdenum layer, thus finishing the scribing of the module, with the schematic view of the scribing being shown in FIG. 5, wherein the width of the scribed line is 47 µm and the effect after the scribing is as shown in FIG. 8; from FIG. 8, the dead zone of the module is 196 µm, and the automatic tacking system is used to make sure that the scribed line P3 is parallel with the scribed line P1.

Embodiment 2

Step 1 is the same as that in Embodiment 1.

Step 2, scribing of P1: using a picosecond laser with pulse width of 8 picoseconds, wavelength of 532 nm, scribing power of 2.5 W, single pulse energy of 31.25 µJ, repetition frequency of 80 kHz to scribe P1 in a sample with laser entering from the back of the film-coated substrate at a scribing speed of 2 m/s, wherein the width of the scribed line is 35 µm, and the molybdenum layer in the scribed line is completely removed to expose the surface of the soda-lime glass.

Step 3 to step 8 are the same as those in Embodiment 1.

Embodiment 3

Step 1 is the same as that in Embodiment 1.

Step 2, scribing of P1: using a nanosecond laser with pulse width of 10 nanoseconds, wavelength of 1064 nm, scribing power of 3.2 W, single pulse energy of 40 µJ, repetition frequency of 80 kHz to scribe P1 in a sample with laser entering from the back of the film-coated substrate at a scribing speed of 2 m/s, wherein the width of the scribed line is 33 µm, and the Mo layer in the scribed line is completely removed to expose the surface of the soda-lime glass.

Step 3 to step 8 are the same as those in Embodiment 1.

Embodiment 4

Step 1 is the same as that in Embodiment 1.

Step 2, scribing of P1: using a sub-nanosecond laser with pulse width of 800 picoseconds, wavelength of 532 nm, scribing power of 0.65 W, single pulse energy of 8.13 µJ, repetition frequency of 80 kHz to scribe P1 in a sample with laser from the back of the film-coated substrate at a scribing speed of 2 m/s, wherein the width of the scribed line is 30 µm, and the molybdenum layer in the scribed line is completely removed to expose the surface of the soda-lime glass.

Step 3 to step 8 are the same as those in Embodiment 1.

Embodiment 5

Step 1 to step 5 are the same as those in Embodiment 1.

Step 6: scribing of P2: using a sub-nanosecond laser with pulse width of 800 picoseconds, wavelength of 532 nm, scribing power of 2.1 W, single pulse energy of 5 µJ, and repetition frequency of 100 kHz to scribe P2 in a sample with laser from the back of the film-coated substrate at a scribing speed of 0.2 m/s, wherein the width of the scribed line is 48 µm, the intrinsic zinc oxide layer, cadmium sulfide and copper indium gallium selenide layer are completely scribed off to expose the molybdenum layer, and an automatic tacking system is used to make sure that the scribed lines P2 is parallel with the scribed line P1.

Step 7 to step 8 are the same as those in Embodiment 1.

While the present invention has been described in detail with reference to the preferred embodiments described above, it should be appreciated that the foregoing description should not be construed as limiting the invention. Various modifications and substitutions will be apparent to those skilled in the art upon reading the foregoing contents. Accordingly, the scope of the present invention should be defined by the appended claims.

The invention claimed is:

1. A full-laser scribing method for a large-area copper indium gallium selenide thin-film solar cell module, comprising the following steps:
   (1) preparing a molybdenum layer on a soda-lime glass substrate;
   (2) using a laser I for scribing to scribe off the molybdenum layer to form a first scribed line (P1), wherein the first scribed line (P1) is scribed till reaching the surface of the glass substrate so that sub-cells on both sides of the first scribed line (P1) are completely insulated,
   wherein the first scribed line (P1) is scribed with laser entering from a film surface, in which the laser beams are in a direction of a thin film-coated surface and are focused on the thin film surface through a focusing lens;
   wherein the laser I is a nanosecond laser, a sub-nanosecond laser, or a picosecond laser;
   wherein the nanosecond laser is a pulse fiber laser with a laser wavelength mode of one or more of 1064 nm, 532 nm and 355 nm, a beam mode of TEM00, a beam quality of less than 1.3, a pulse width of 1 to 600 nanoseconds, a single pulse energy of 1 µJ to 2000 µJ, a pulse repetition frequency of 1 kHz to 1000 kHz, and an average power of 0 to 25 watts; the sub-nanosecond laser is a semiconductor laser with a laser wavelength mode of one or more of 1064 nm, 532 nm and 355 nm, a beam mode of TEM00, a beam quality of less than 1.3, a pulse width of 600 to 2000 picoseconds, a single pulse energy of 1 µJ to 300 µJ, a pulse repetition frequency of 10 kHz to 100 kHz, and an average power of 0 to 3 watts; the picosecond laser is a pulse fiber laser with a laser wavelength mode of one or more of 1064 nm, 532 nm and 355 nm, a beam mode of TEM00, a beam quality of less than 1.3, a pulse width of less than 10 picoseconds, a single pulse energy of 1 µJ to 40 µJ, a pulse repetition frequency of 1 Hz to 1000 KHz, and an average power of 0 to 6 watts;

(3) preparing a copper indium gallium selenide film layer on the molybdenum layer;

(4) preparing a cadmium sulfide layer on the copper indium gallium selenide film layer;

(5) preparing an intrinsic zinc oxide layer on the cadmium sulfide layer;

(6) using a laser II for scribing to scribe off the intrinsic zinc oxide layer, the cadmium sulfide layer and the copper indium gallium selenide layer simultaneously to expose the molybdenum layer and thus form a second scribed line (P2), wherein the second scribed line (P2) completely scribes off the intrinsic zinc oxide layer, the cadmium sulfide layer and the copper indium gallium selenide layer without damaging the surface of the molybdenum layer, and the second scribed line (P2) keeps parallel to the first scribed line (P1), wherein the second scribed line (P2) is scribed with laser entering from the film surface, and the width of the second scribed line (P2) is 46.64 µm or 48 µm; wherein the laser II is a picosecond laser or a sub-nanosecond laser;

when the width of the second scribed line is 46.64 µm, the used laser II is a picosecond laser with pulse width of 8 picoseconds, wavelength of 1064 nm, scribing power of 5 W, single pulse energy of 5 µJ, repetition frequency of 1000 kHz, and a scribing speed of 2 m/s;

when the width of the second scribed line is 48 µm, the used laser II is a sub-nanosecond laser with pulse width of 800 picoseconds, wavelength of 532 nm, scribing power of 2.1 W, single pulse energy of 5 µJ, repetition frequency of 100 kHz, and a scribing speed of 0.2 m/s;

(7) preparing an aluminum-doped zinc oxide layer on the intrinsic zinc oxide layer;

(8) using a laser III for scribing to scribe off the aluminum-doped zinc oxide layer, the intrinsic zinc oxide layer, the cadmium sulfide layer and the copper indium gallium selenide layer simultaneously to expose the molybdenum layer and form a third scribed line (P3), thus completing inner connection of sub-cells of the solar cell module, wherein the third scribed line (P3) is formed by completely scribing off the aluminum-doped zinc oxide layer, the intrinsic zinc oxide layer, the cadmium sulfide layer and the copper indium gallium selenide layer without damaging the surface of the molybdenum layer, and wherein the third scribed line (P3) keeps parallel to the first scribed line (P1) and the second scribed line (P2).

2. The full-laser scribing method according to claim 1, wherein the laser III is a nanosecond laser, a sub-nanosecond laser, or a picosecond laser.

3. The full-laser scribing method according to claim 2, wherein when the laser III is a nanosecond laser, the nanosecond laser is a pulse fiber laser with a laser wavelength mode of one or more of 1064 nm, 532 nm and 355 nm, a beam mode of $TEM_{00}$, a beam quality of less than 1.3, a pulse width of 1 to 600 nanoseconds, a single pulse energy of 1 µJ to 2000 µJ, a pulse repetition frequency of 1 kHz to 1000 kHz, and an average power of 0 to 25 watts; when the laser III is a sub-nanosecond laser, the subnanosecond laser is a semiconductor laser with a laser wavelength mode of one or more of 1064 nm, 532 nm and 355 nm, a beam mode of $TEM_{00}$, a beam quality of less than 1.3, a pulse width of 600 to 2000 picoseconds, a single pulse energy of 1 µJ to 300 µJ, a pulse repetition frequency of 10 kHz to 100 kHz, and an average power of 0 to 3 watts; when the laser III is a picosecond laser, the picosecond laser is a pulse fiber laser with a laser wavelength mode of one or more of 1064 nm, 532 nm and 355 nm, a beam mode of $TEM_{00}$, a beam quality of less than 1.3, a pulse width of less than 10 picoseconds, a single pulse energy of 1 µJ to 40 µJ, a pulse repetition frequency of 1 Hz to 1000 KHz, and an average power of 0 to 6 watts.

4. The full-laser scribing method according to claim 1, wherein in step (1), the thickness of the molybdenum layer ranges from 600 to 1200 nanometers.

5. The full-laser scribing method according to claim 1, wherein in step (3), the thickness of the copper indium gallium selenide layer ranges from 1.0 to 2.0 micrometers, the thickness of the cadmium sulfide layer ranges from 30 to 80 nanometers; the thickness of the intrinsic zinc oxide film layer ranges from 50 to 150 nanometers.

6. The full-laser scribing method according to claim 1, wherein in step (5), the thickness of the aluminum-doped zinc oxide film layer ranges from 300 to 1000 nanometers.

7. The full-laser scribing method according to claim 4, wherein in step (3), the thickness of the copper indium gallium selenide layer ranges from 1.0 to 2.0 micrometers, the thickness of the cadmium sulfide layer ranges from 30 to 80 nanometers; the thickness of the intrinsic zinc oxide film layer ranges from 50 to 150 nanometers.

8. The full-laser scribing method according to claim 5, wherein in step (5), the thickness of the aluminum-doped zinc oxide film layer ranges from 300 to 1000 nanometers.

* * * * *